(12) United States Patent
Diaconu

(10) Patent No.: US 11,201,421 B2
(45) Date of Patent: Dec. 14, 2021

(54) PRINTED CIRCUIT BOARD MOUNTING ARRANGEMENT

(71) Applicant: VITESCO TECHNOLOGIES GMBH, Hannover (DE)

(72) Inventor: Dorin Diaconu, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 0 days.

(21) Appl. No.: 16/652,711

(22) PCT Filed: Sep. 28, 2018

(86) PCT No.: PCT/EP2018/076443
§ 371 (c)(1),
(2) Date: Apr. 1, 2020

(87) PCT Pub. No.: WO2019/072591
PCT Pub. Date: Apr. 18, 2019

(65) Prior Publication Data
US 2020/0295481 A1    Sep. 17, 2020

(30) Foreign Application Priority Data

Oct. 10, 2017 (EP) .................................. 17465560

(51) Int. Cl.
*H01R 12/70* (2011.01)
*H01R 12/58* (2011.01)
*H05K 5/00* (2006.01)

(52) U.S. Cl.
CPC ....... *H01R 12/7064* (2013.01); *H01R 12/585* (2013.01); *H05K 5/0069* (2013.01); *H01R 2201/26* (2013.01)

(58) Field of Classification Search
CPC ............ H01R 23/7026; H01R 23/7057; H01R 13/6658; H01R 12/7064; H01R 12/585; H05K 5/0069
USPC .................................................. 439/567, 76.1
See application file for complete search history.

(56) References Cited

U.S. PATENT DOCUMENTS

| 4,435,031 A | * | 3/1984 | Black | H01R 12/7029 174/138 D |
| 4,477,142 A | | 10/1984 | Cooper et al. | |
| 4,710,132 A | | 12/1987 | Glomb et al. | |
| 5,074,807 A | * | 12/1991 | Parmer | H01R 13/6275 439/553 |
| 5,334,049 A | | 8/1994 | Kachlic et al. | |
| 5,336,110 A | | 8/1994 | Mosquera | |

(Continued)

FOREIGN PATENT DOCUMENTS

| CN | 1713800 A | 12/2005 |
| CN | 103025105 A | 4/2013 |

(Continued)

*Primary Examiner* — Gary F Paumen
(74) *Attorney, Agent, or Firm* — Laurence A. Greenberg; Werner H. Sterner; Ralph E. Locher

(57) ABSTRACT

A printed circuit board mounting arrangement, in particular for use in environments with an aggressive vibration profile such as a motor vehicle, includes a housing and a circuit board secured to a connector body by mechanical press fit pins extending through location holes on a flange formed on the connector body to the printed circuit board. The arrangement provides for a secure connection that can achieve a high IP rating.

7 Claims, 3 Drawing Sheets

(56) References Cited

U.S. PATENT DOCUMENTS

| | | | |
|---|---|---|---|
| 5,393,247 A * | 2/1995 | DiOrazio | H01R 12/7064 411/510 |
| 5,490,787 A | 2/1996 | Bowman et al. | |
| 5,551,891 A * | 9/1996 | Huss, Jr. | H01R 12/7064 439/567 |
| 5,593,307 A | 1/1997 | Bale et al. | |
| 5,664,965 A * | 9/1997 | Clark | H01R 12/7029 439/567 |
| 5,863,222 A | 1/1999 | Kinsey, Jr. et al. | |
| 5,980,314 A | 11/1999 | Roberts | |
| 5,989,064 A * | 11/1999 | Harlan | H01R 12/7064 439/567 |
| 6,319,023 B2 | 11/2001 | Goto et al. | |
| 6,319,058 B1 * | 11/2001 | Jones | H01R 12/7029 439/567 |
| 6,471,544 B1 * | 10/2002 | Huang | H01R 12/7029 439/567 |
| 6,475,023 B2 | 11/2002 | Cameling | |
| 6,554,643 B1 | 4/2003 | Whiting | |
| 6,558,200 B1 * | 5/2003 | Choy | H01R 12/725 439/637 |
| 6,561,829 B2 | 5/2003 | Maeda et al. | |
| 6,716,060 B2 | 4/2004 | Gollhofer et al. | |
| 6,761,586 B2 | 7/2004 | Kayama et al. | |
| 7,094,072 B2 * | 8/2006 | Takase | H01R 12/7023 361/752 |
| 7,140,885 B2 * | 11/2006 | Kitamura | H05K 5/0039 439/76.1 |
| 7,249,957 B2 | 7/2007 | Watanabe et al. | |
| 8,177,581 B2 * | 5/2012 | Zeng | H01R 12/7052 439/567 |
| 8,657,609 B2 | 2/2014 | Yanagisawa et al. | |
| 2002/0127916 A1 | 9/2002 | Zhang | |
| 2003/0096517 A1 | 5/2003 | Ho | |
| 2005/0221668 A1 * | 10/2005 | Hara | H01R 12/7029 439/567 |
| 2005/0287540 A1 | 12/2005 | Murphy et al. | |
| 2005/0287840 A1 | 12/2005 | Takase et al. | |
| 2005/0287841 A1 | 12/2005 | Kitamura | |

FOREIGN PATENT DOCUMENTS

| | | |
|---|---|---|
| CN | 105830298 A | 8/2016 |
| DE | 20113884 U1 | 1/2003 |
| DE | 102008037278 A1 | 2/2010 |
| EP | 0182070 A2 | 5/1986 |
| EP | 0649195 A1 | 4/1995 |
| EP | 0729203 A2 | 8/1996 |
| EP | 9930812 A2 | 7/1999 |
| WO | 9308619 A1 | 4/1993 |
| WO | 2015098482 A1 | 7/2015 |

* cited by examiner

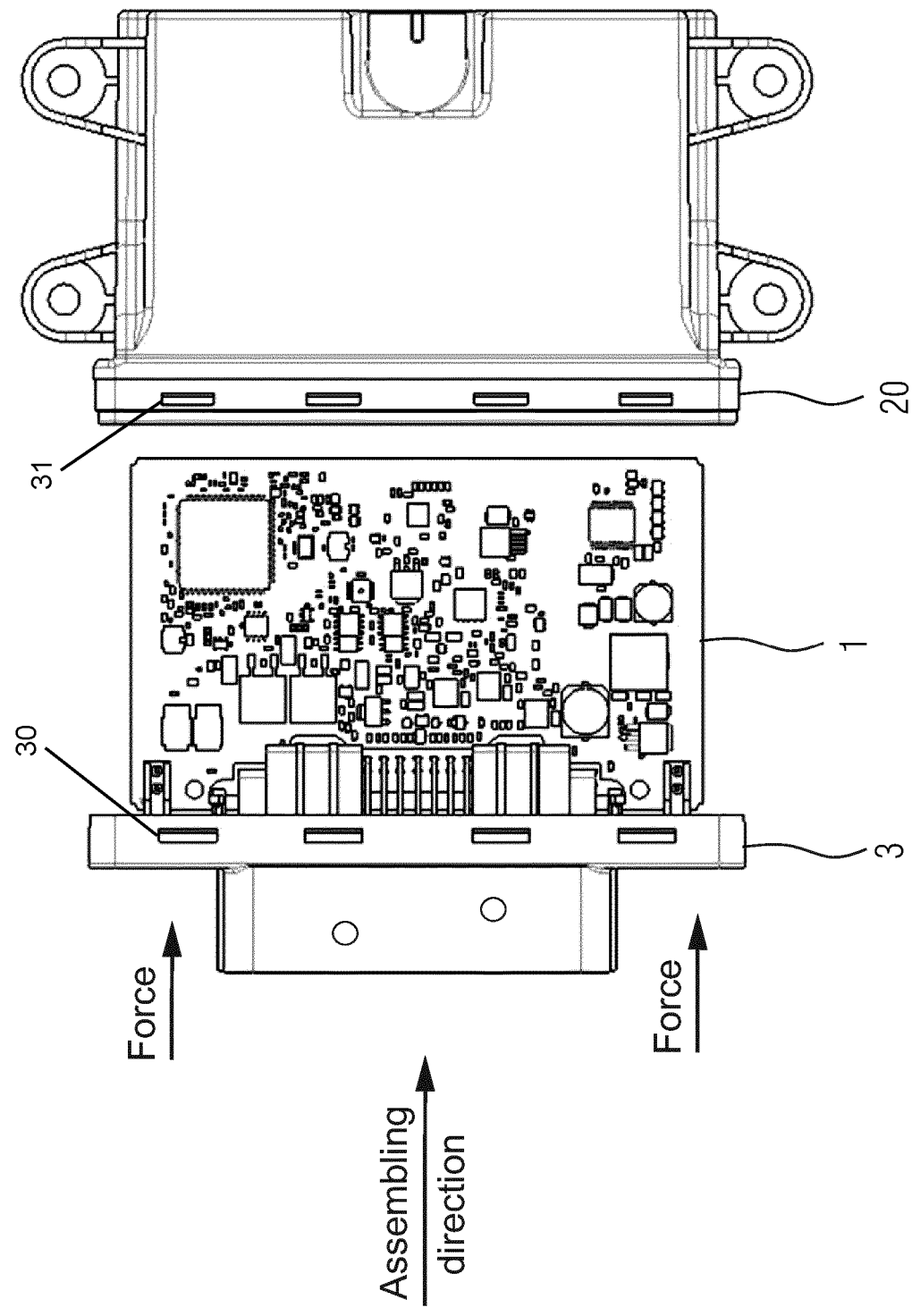

PRINTED CIRCUIT BOARD MOUNTING ARRANGEMENT

BACKGROUND OF THE INVENTION

Field of the Invention

The invention relates to a printed circuit board mounting arrangement in a housing, in particular, but not exclusively, for use in environments with an aggressive vibration profile such as a motor vehicle.

Many systems in motor vehicles are controlled by means of electronic control units. These devices comprise electronic components, in particular sensors for the detection of physical parameters such as accelerometers, which are used in diverse applications such as airbag controls and stability control systems. If the electronic control unit determines that the accelerometer output is outside a certain parameter range, a control signal is produced to, for example, activate the airbag or stability control.

For the installation of the electronic components in the vehicle interior, the electronic control unit typically comprises a housing in which a printed circuit board with electronic components mounted thereon is positioned. The housing is provided with a connection unit, which connection electrically contacts the carrier and as a result, the electronic components on the carrier. The control unit can be connected to a system to be controlled via the connection.

As in use the vehicle engine will generate vibrations in the vehicle chassis, steps are taken to reduce the effects of such vibration on the printed circuit board components. In order to ensure a vibration-free mounting of the printed circuit board in the housing of the control device and thus an unadulterated signal transmission, circuit boards with self-tapping or cutting mounting screws, which are rotated into the housing, have been used widely. Other types of fastening of the circuit board are, for example, the caulking of the printed circuit board in the housing via plastic pins and hot gas rivets. In addition, it is known to effect a fastening of printed circuit boards in the housing by means of clamping springs.

DE 10 2008 037 278 discloses a device which has a mount designed as a printed circuit board (PCB), where an assembly of electronic components containing a sensor is placed in the mount. A connection unit connects the device to an electronic system to be controlled. The mount with the electronic components assembly is arranged in the housing. The housing, the connection unit and the mount are mechanically fixed in a stiffening frame at a region of the sensor using screws, where the device is mechanically mounted on a mounting surface. The device disclosed in this document suffers from an additional problem in that the electrical pins are occasionally bent during mounting and so the assembly process is expensive.

All electronic control devices known from the prior art suffer from the problem that the transmission of vibrations to the printed circuit board cannot be effectively prevented. In particular, vibrations can occur in the region of the sensor and lead to a falsification of measuring signals and thus, under certain circumstances, to a fault behavior of the system to be controlled.

The known solutions suffer from the additional problem that during the assembly process of the connector into the housing, the forces that act on the header can cause stress to the electrical connection pins.

SUMMARY OF THE INVENTION

It is an object of the present invention to provide a circuit board mounting arrangement with a connector that is less liable to produce stress on the connection pins during the installation process This object is achieved with a circuit board mounting arrangement having the features described below. Further preferred or advantageous embodiments and developments are specified in the sub-claims, the following description and the drawings.

A printed circuit board mounting arrangement for use in an environment with an aggressive vibration profile is disclosed according to one aspect. The printed circuit board mounting arrangement can also be denoted as a printed circuit board mounting assembly. It comprises a connector body having a flange, which flange is provided with a location hole. It further comprises a printed circuit board being provided with a corresponding location hole. In addition, it comprises a mechanical press fit pin providing a mechanical connection between the connector and the printed circuit board, wherein the connector body is configured to co-operate with a housing, which housing receives the printed circuit board to form a closed assembly. For providing the mechanical connection, the press fit pin is in particular received in the location hole of the flange. It may expediently also be received in the corresponding location hole of the printed circuit board.

In particular, the flange extends across a portion of the length of the printed circuit board. The flange may expediently project at a side of the connector body facing towards the PCB and in a direction parallel to a main extension plane of the PCB.

According to a further aspect, the present disclosure relates to a printed circuit board mounting in a housing, in particular, for use in environments with an aggressive vibration profile such as a motor vehicle. The circuit board is secured to a connector body by means of mechanical press fit pins extending through location holes on a flange formed on the connector to the printed circuit board.

The solution according to the present disclosure has the ad-vantage that the printed circuit board can be rigidly mounted so that there is no flutter on the board even in locations with an aggressive vibration profile such as the wheel arch of a vehicle. The solution can also be mounted in a one step process, in contrast to the prior art solution which had a two part construction process, with a much reduced likelihood of electrical pin damage.

The arrangement may provide for a secure connection that can achieve a high IP rating. In particular, the arrangement of the invention may advantageously dispense with soldering in the fastening, which reduces the fumes produced in the production process and the quantity of toxic compounds in the device whilst enabling a higher IP rating.

According to one embodiment, the connector body is provided with first and second flanges, each of which flanges is provided with at least one location hole, each of which location holes receives a press fit pin in the installed position. Expediently, the PCB may comprise a plurality of corresponding location holes, each corresponding location hole of the PCB being assigned to one of the location holes of the first and second flanges. For example, each of the first and second flanges comprises at least two location holes, receiving first and second press fit pins, respectively. In one development, the first and second press fit pins are The printed circuit board mounting arrangement may further comprise the housing according to some embodiments. In one embodiment, the housing is provided with first and second rails formed on an interior wall, which rails are configured to receive the printed circuit board and to substantially retain the printed circuit board in position. In a further embodiment, the housing is provided with one or more webs having a cut out to receive the printed circuit board and to substantially retain the printed circuit board in position.

In one embodiment, the connector is provided with a bracket, on which bracket the flanges are formed.

In one embodiment, the connector is provided with a push fit connector which is operable to rigidly connect the connector to the housing.

An exemplary embodiment of the invention will now be described in greater detail with reference to the drawings.

BRIEF DESCRIPTION OF THE SEVERAL VIEWS OF THE DRAWING

FIG. 4 shows the printed circuit board and connector body immediately prior to insertion in the housing.

DETAILED DESCRIPTION OF THE INVENTION

Figure 1:
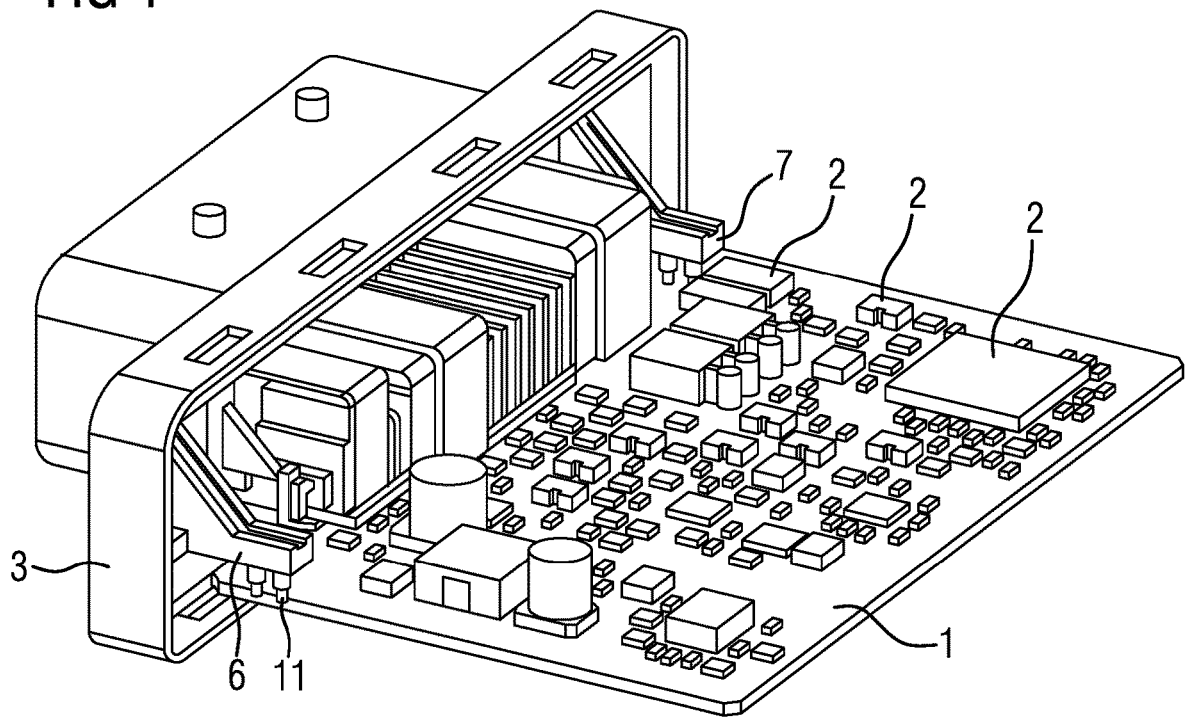
FIG. 1 shows a perspective view of a PCB mounting arrangement according to an exemplary embodiment.

FIG. 1 shows a perspective view of a printed circuit board mounting arrangement according to an exemplary embodiment of the invention. It comprises a printed circuit board (PCB) 1 having a plurality of components 2 mounted thereon and a connector arrangement for the printed circuit board 1. The printed circuit board 1 is mounted on a connector body 3 of the connector arrangement, which connector body 3, in use, is connected to a housing for the printed circuit board 1. The printed circuit board 1 is provided with—in particular drilled—holes 4 which receive electrical pins 5 to provide the electrical connection to the vehicle communication bus.

First and second brackets 6, 7 are provided at opposed edges of the connector body. Each bracket comprises a triangular form with the opposite end attached to the connector body and the end adjacent to the printed circuit board 1 being provided with a grooved flange 8 extending a short distance across the length of the printed circuit board 1. The brackets 6, 7 with the flanges 8 project at a side of the connector body 3 which faces towards the PCB 1, opposite of the side of the connector body 3 which is provided for engaging with a mating connector.

The flange 8 is provided with two location holes 9 and the printed circuit board 1 is provided with two corresponding location holes 10. Mechanical press fit pins 11 are provided in each corresponding hole pair 9, 10 to provide a mechanical rather than an electrical connection between the bracket 6, 7 and the printed circuit board 1. The pins 11 are adapted to transfer the pressure applied on the connector body during the assembly process of the PCB arrangement with the housing. The two pins 11 are connected by and preferably in one piece with a web extending laterally between the pins 11. The web is sandwiched between the flange 8 and the PCB 1. The press fit pins 11 may be electrically insulated from all conductor tracks of the PCB or grounded in this and other embodiments. It is also conceivable that the press fit pins 11 are made from an insulating material in this or other embodiments, for example from plastic.

The press fit pins 11 both fix and orientate the printed circuit board 1 during the initial press fit process and eliminate the possibility of deformation of the electrical pins caused by the application of forces on the support structure perpendicular to the connector that might otherwise arise. The fixing process can be performed in a single step without additional production steps. The mechanical press fit connection enables screws to be dispensed with, which advantageously enables the use of a closed housing. The use of a closed housing enables the device to achieve a higher IP rating than has been possible before and so the housing can be installed in places subject to aggressive environmental media such as a vehicle wheel arch.

Figure 2:
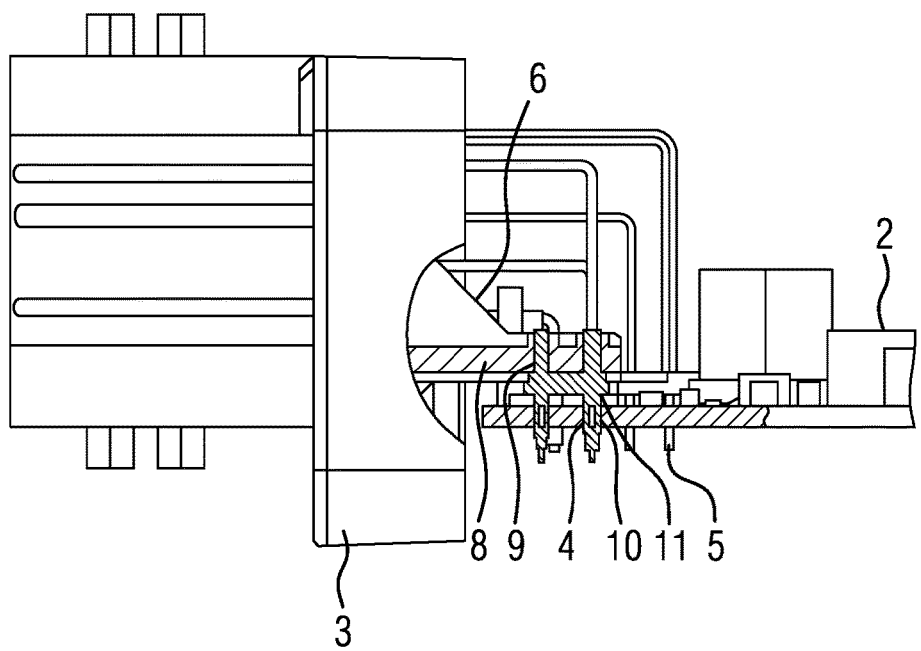
FIG. 2 shows a side view partially in cross section of the PCB mounting arrangement.

FIG. 2 shows a side view partially in cross section of the connector arrangement with the printed circuit board 1 attached to the connector 3. The printed circuit board is provided with components 2 and drilled holes 4 which receive electrical pins 5. The brackets 6, 7 and flanges 8 extend laterally from the connector 3 and are provided with location holes 9. Press fit pin 11 is inserted through the location hole 9 and into and through a corresponding hole 10 on the printed circuit board. The electrical pins 5 also extend through the circuit board to provide the electrical connection from the connector body to the printed circuit board.

Figure 3:
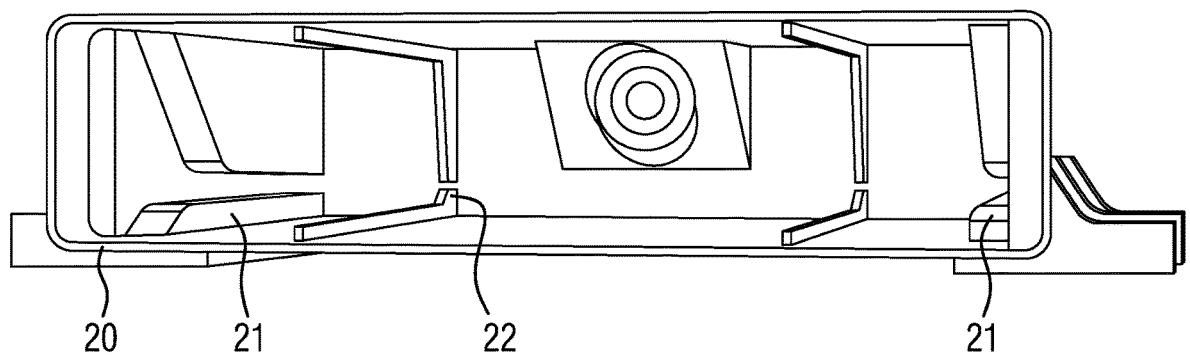
FIG. 3 shows a perspective view of the housing into which the PCB is mounted.

FIG. 3 shows a perspective view of the interior of the housing 20 into which the printed circuit board is mounted. The housing 20 has a rectangular opening defined by two lateral walls parallel to the surface of the printed circuit board in the installed position and two walls perpendicular to the printed circuit board. Two rails 21 are formed on the interior of the perpendicular walls, which rails have an opening adapted to facilitate the insertion of the printed circuit board during assembly but which narrows towards the rear wall of the housing so that the printed circuit board is held in position by the rails on the side wall. The rear interior wall of the housing is provided with two substantially vertical webs 22 that have a small cut out adapted to receive and substantially retain the printed circuit board in the installed position. The housing is further provided with mounting points on its exterior so that it can be screwed or bolted to a vehicle. A valve is provided to enable air to enter and exit the housing once it is assembled. The printed circuit board is therefore retained on each of its edges and so is able to be used in significantly more aggressive vibratory environments such as in the vicinity of a vehicle wheel arch.

FIG. 4 shows the printed circuit board 1 and connector body 3 immediately prior to insertion in the housing 20. The connector body is provided with a series of resilient clips 30 adapted to engage in corresponding elements 31 on the housing 20 to fix the printed circuit board and connector in position in the housing, which can then be mounted in a vehicle. The connector arrangement advantageously can be assembled in a single process by a robot. The robot does not need to press the printed circuit board against the housing as part of the assembly. The assembly process is therefore lower cost and also has a lower likelihood of the printed circuit board being damaged either during the assembly process or due to flutter caused by vibration when installed in a vehicle.

The invention claimed is:

1. A printed circuit board mounting arrangement for use in an environment with an aggressive vibration profile, the printed circuit board mounting arrangement comprising:
   a housing;

a connector body configured to cooperate with said housing, said connector body having at least one flange, said at least one flange having a location hole formed therein;

a printed circuit board configured to be received by said housing to form a closed assembly, said printed circuit board having a location hole formed therein corresponding to said location hole formed in said at least one flange; and at least one mechanical press fit pin received in said location hole formed in said at least one flange and in said location hole formed in said printed circuit board to provide a mechanical connection between said connector body and said printed circuit board;

said location hole formed in said at least one flange is two location holes formed in said at least one flange and said location hole formed in said printed circuit board is two location holes formed in said printed circuit board, said press fit pin is two pins connected by a connecting web extending between said pins, said connecting web being sandwiched between said at least one flange and said printed circuit board.

2. The printed circuit board mounting arrangement according to claim 1, wherein:

said at least one flange of said connector body includes first and second flanges;

said location holes formed in said at least one flange includes respective location holes formed in each of said flanges; and said pins connected by a connecting web is two sets of pins connected by a connecting web each set being received in respective said location holes formed in said flanges in an installed position.

3. The printed circuit board mounting arrangement according to claim 1, wherein said housing includes an interior wall, and first and second rails formed on said interior wall, said rails being configured to receive said printed circuit board and to substantially retain said printed circuit board in place.

4. The printed circuit board mounting arrangement according to claim 1, wherein said housing has one or more webs having a cutout formed therein for receiving said printed circuit board and substantially retaining said printed circuit board in place.

5. The printed circuit board mounting arrangement according to claim 3, wherein said housing has one or more webs having a cutout formed therein for receiving said printed circuit board and substantially retaining said printed circuit board in place.

6. The printed circuit board mounting arrangement according to claim 1, wherein said connector body includes at least one bracket on which said at least one flange is formed.

7. The printed circuit board mounting arrangement according to claim 1, wherein said connector body includes a resilient clip to rigidly connect said connector body to said housing.

* * * * *